(12) United States Patent
Buchar et al.

(10) Patent No.: US 9,874,815 B2
(45) Date of Patent: Jan. 23, 2018

(54) CHIPLESS RADIO FREQUENCY IDENTIFICATION (RFID) MADE USING PHOTOGRAPHIC PROCESS

(71) Applicant: XEROX CORPORATION, Norwalk, CT (US)

(72) Inventors: Wayne A. Buchar, Bloomfield, NY (US); George A. Gibson, Fairport, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 15/154,712

(22) Filed: May 13, 2016

(65) Prior Publication Data

US 2017/0329230 A1    Nov. 16, 2017

(51) Int. Cl.
*G03C 5/26* (2006.01)
*G03F 7/20* (2006.01)
*G06K 7/10* (2006.01)

(52) U.S. Cl.
CPC .............. *G03F 7/2053* (2013.01); *G03F 7/20* (2013.01); *G06K 7/10009* (2013.01)

(58) Field of Classification Search
CPC .................................................. G03C 1/49818
USPC ........................................ 430/319, 416, 417
See application file for complete search history.

(56) References Cited

U.S. PATENT DOCUMENTS

| 3,033,765 | A | | 5/1962 | King et al. |
| 4,298,684 | A | * | 11/1981 | Bouldin .................. G03C 5/40 |
| | | | | 430/246 |
| 4,818,852 | A | * | 4/1989 | Haddock ................ B42D 25/23 |
| | | | | 235/462.01 |
| 9,247,640 | B2 | | 1/2016 | Lushington |
| 2015/0154488 | A1 | | 6/2015 | Heo et al. |
| 2015/0186768 | A1 | | 7/2015 | Peters |

FOREIGN PATENT DOCUMENTS

CN    101271996 A    9/2008

* cited by examiner

*Primary Examiner* — Daborah Chacko Davis
(74) *Attorney, Agent, or Firm* — MH2 Technology Law Group LLP

(57) ABSTRACT

A method for forming a structure for a radio frequency identification device includes dispensing a photosensitive compound onto a substrate. Subsequently, first portions of the photosensitive compound are exposed to a light pattern from a light source, while second portions of the photosensitive compound remain unexposed to the light source. Exposing the photosensitive compound to light reduces the photosensitive compound to a metal layer. The unexposed second portions of the photosensitive compound may be rinsed away to leave the metal layer. Processing may continue to form an RFID circuit from the metal layer, and a completed RFID transponder comprising the RFID circuit.

16 Claims, 3 Drawing Sheets

CHIPLESS RADIO FREQUENCY IDENTIFICATION (RFID) MADE USING PHOTOGRAPHIC PROCESS

TECHNICAL FIELD

The present teachings relate generally to chipless radio frequency identification (RFID) tags and, more particularly, to a method for making RFID tags.

BACKGROUND

Radio frequency identification (RFID) technology has become increasingly commonplace for use in inventory tracking, loss prevention, and other uses. An RFID system may include a transponder or tag that is placed on an object and an interrogator or reader that wirelessly receives information transmitted by the tag. RFID tags may be broadly classified as active tags that include a local power source such as a battery, or passive tags that are activated by electromagnetic waves generated by the reader that induce a current in an antenna within the tag.

RFID tags can include an electronic circuit that may be in the form of an chip or integrated circuit (IC). The chip may store data that is communicated to the reader. In contrast, a chipless RFID tag has neither an integrated circuit nor discrete active electronic components, and may be printed directly onto a substrate resulting in a lower cost than a chipped RFID tag.

A chipless RFID tag may include a receive antenna that intercepts interrogator output, a transmit antenna that broadcasts data that is received by the interrogator, and a plurality or array of resonators (i.e., a multiresonator) electrically coupled between the receive antenna and the transmit antenna. During use, the reader may output a broad band or spectrum of radio frequencies. Depending on the configuration of the multiresonator, one or more of the radio frequencies may include a frequency-dependent antenna load that is intercepted by the receive antenna and causes the multiresonator to resonate. The resonation modifies the signal that is transmitted by the transmit antenna and may be received by the interrogator. Each RFID tag may be encoded by etching a conductive film to result a specific set of patterned resonant structures that form the multiresonator. For unique identification of a particular tag from a set of tags, each transponder must be made to include a unique multiresonator design, which is an expensive process.

The receive antenna, the transmit antenna, and resonators may be prepared using one or more patterning techniques to pattern a conductive layer, for example a metal layer. Various patterning techniques may be used, for example, stamping, chemical etching, mechanical etching, laser etching, direct writing of a metal layer, vapor deposition, etc.

In one technique, portions of a foil master, such as a metallized Mylar layer, are etched away using, for example, laser ablation to create the final structure. However, laser ablation of a metallized layer is a relatively slow process, and lasers that are suitable for ablation of a metallized layer are costly.

As a practical matter, RFID technology uses radio frequencies that have much better penetration characteristics to material than do optical signals, and will work under more hostile environmental conditions than bar code labels. Therefore, the RFID tags may be read through paint, water, dirt, dust, paper, human bodies, concrete, or through the tagged item itself. RFID tags may be used in managing inventory, automatic identification of cars on toll roads, security systems, electronic access cards, keyless entry and the like.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

An embodiment of a method for forming a radio frequency identification (RFID) device includes dispensing a photosensitive compound onto a substrate to form a layer, wherein the layer comprises the photosensitive compound and has a silver concentration on the substrate of from 5.0 milligrams per square meter ($mg/m^2$) to 150 $mg/m^2$. The method further includes exposing first portions of the layer comprising the photosensitive compound to a light pattern from a light source to convert the first portions of the layer comprising the photosensitive compound to a metal layer while second portions of the layer comprising the photosensitive compound remain unexposed to the light pattern, removing the second portions of the layer comprising the photosensitive compound and leaving the metal layer on the substrate, and forming an RFID circuit from the metal layer.

Another embodiment of a method for forming a radio frequency identification (RFID) device includes dispensing a silver halide onto a substrate, wherein the silver halide is dispensed onto the substrate has a silver concentration of from 5.0 milligrams per square meter ($mg/m^2$) to 150 $mg/m^2$. The method further includes exposing first portions of the silver halide to a light pattern from a light source to convert the first portions of the silver halide to a metal layer while second portions of the silver halide remain unexposed to the light pattern, removing the second portions of the silver halide and leaving the metal layer on the substrate, and forming an RFID circuit, wherein the RFID circuit comprises at least one of an antenna and a multiresonator formed from the metal layer.

BRIEF DESCRIPTION OF THE DRAWINGS

The accompanying drawings, which are incorporated in, and constitute a part of this specification, illustrate embodiments of the present teachings and, together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified: the term "chipless" describes an RFID transponder that has neither an integrated circuit nor discrete electronic components, such as a transistor or coil; the term "resonator" or "resonant structure" refers to a structure having an associated resonance corresponding to a characteristic frequency; the term "spectral signature" refers to at least one identifying resonance associated with an applied excitation frequency; the term "tag" refers to a transponder or a combination of a transponder and other structures that may include a carrier on which the transponder is disposed or device package within which the transponder is disposed. A tag may be attached to an article; the term "transponder" refers to a device such as a tag that receives signals, such as those transmitted by an interrogator, and sends one or more response signals in response to the received signals; the term "etched" refers to a process by which portions of a material are removed, such as a chemical etch, a mechanical etch, a laser etch or ablation, etc.; the term "security overlayer" refers to a layer that, when tampered with, damages, destroys or otherwise modifies a structure on which the security overlayer is disposed; the term "generic RFID transponder" means an RFID transponder that has an associated resonant structure for each frequency domain applied by a transmitter, such as an interrogator.

Figure 1:
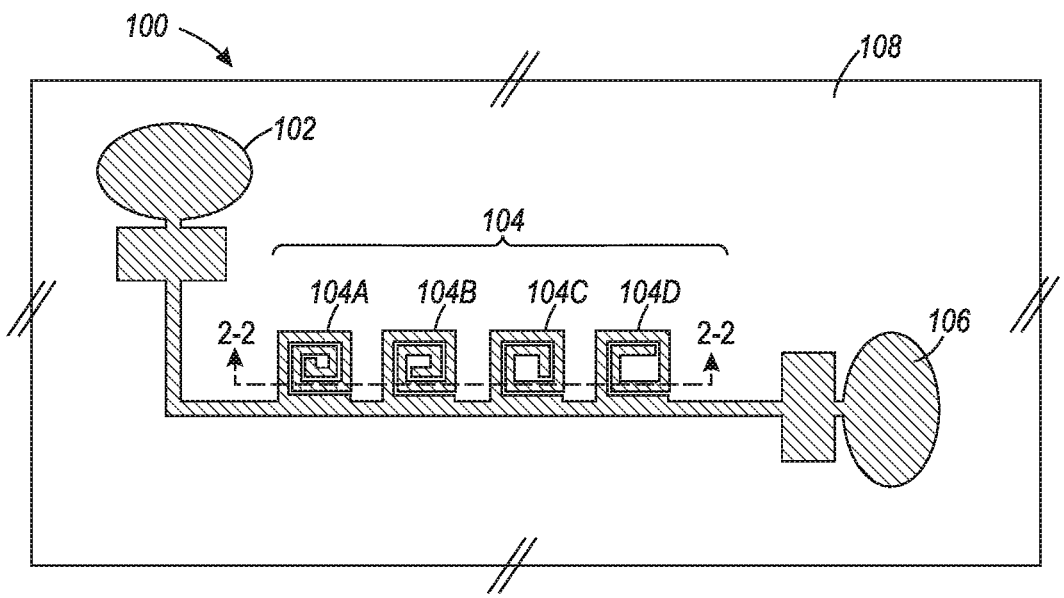
FIG. 1 is a plan view of a portion of a transponder including a receive antenna, a transmit antenna, and a multiresonator formed using an embodiment of the present teachings.
Figure 2:
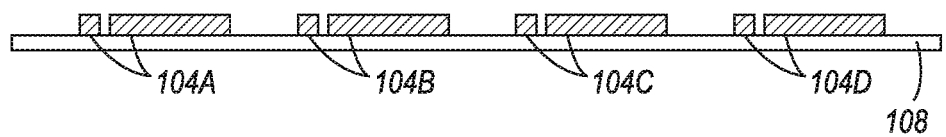
FIG. 2 is a cross section of the multiresonator of FIG. 1.

FIG. 1 is a top view, and FIG. 2 is a magnified cross section along 2-2 of FIG. 1, depicting a portion of a transponder 100 that is part of an RFID tag. Transponder 100 can include a receive antenna 102, a multiresonator 104 including a plurality of resonators 104A-104D, and a transmit antenna 106. As depicted in FIG. 1, each resonator 104A-104D has a unique spiral pattern that causes each resonator to resonate at a different frequency. It will be appreciated that an RFID tag can include other structures that are not depicted for simplicity, while various depicted structures may be removed or modified.

In use, the interrogator outputs a broad spectrum of frequencies that may be received by the receive antenna 102, and that may cause one or more of the resonators 104A-104D to resonate. The number of resonators 104A-104D that resonate and the amplitude at which they resonate results in an output frequency that is translated into an analog signal that is transmitted as a response signal by the transmit antenna 106 to the interrogator. For example, and without limitation to the frequencies specified, resonator 104A may resonate at 2.97 gigahertz (GHz), resonator 104B may resonate at 2.66 GHz, resonator 104C may resonate at 24 GHz, and resonator 104D may resonate at 24.3 GHz. Because the analog signal generated during an interrogation and transmitted by the transmit antenna 106 is unique to the specific tag from a plurality of tags as a result of the unique pattern of resonators 104A-104D, the interrogator can identify the specific tag from the plurality of tags. The transponder 100 may be disposed on a carrier 108 such as directly on an article or on an intermediate adhesive backing for attaching onto an article. The carrier 108 may be a substrate on which the RFID transponder is initially fabricated or may be a carrier on which an RFID transponder is transferred onto after it is fabricated. A carrier 108 having an adhesive backing may allow the RFID transponder to be easily attached (i.e., tagged) onto an article.

An embodiment of the present teachings is used to form one or more structures of an RFID device, such as an antenna, a multiresonator, or another structure of the RFID device. While the fabrication method is described below with reference to the formation of one or more multiresonators, the formation of other RFID structures is contemplated.

Figure 3:
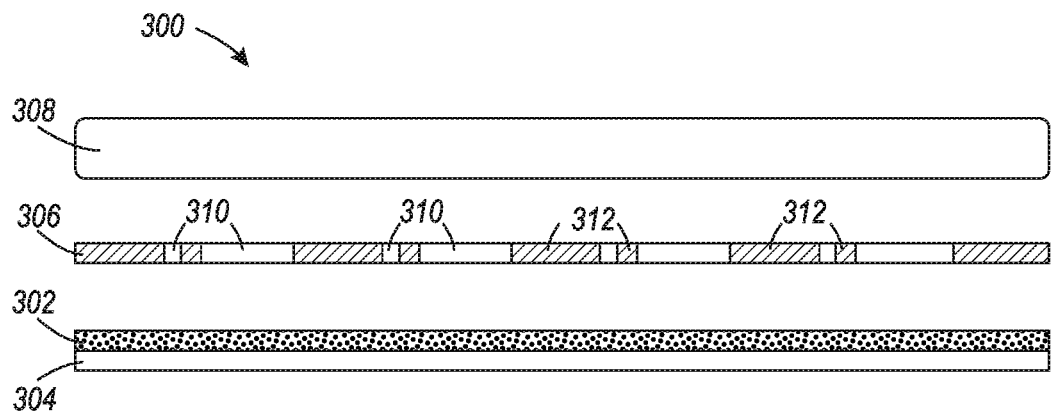
FIG. 3 is a cross section of a light source, a mask or reticle, and an in-process substrate having a photosensitive compound formed over the substrate during an embodiment of the present teachings.

FIG. 3 depicts an assembly 300, for example, an assembly at a manufacturing station for fabricating a portion of an RFID device. In FIG. 3, a photosensitive compound 302 is coated onto a substrate 304. A patterned mask or reticle (hereinafter, collectively, "mask") 306 may be positioned between the substrate 304 and a light source 308 as depicted.

The mask 306 may include transparent or translucent first regions 310 through which light can pass and opaque second regions 312 that block the transfer of light. Various masks 306 sufficient for an embodiment of the present teachings are known in the art, such as glass or quartz patterned with an opaque material such as chrome or another material.

The photosensitive compound 302 is a material that changes chemical makeup when exposed to light. Prior to being exposed to light, the photosensitive compound 302 is dissolvable within a solvent and may be rinsed away using the solvent. Exposure to light changes the chemical makeup of the photosensitive compound 302 such that it is not dissolvable within the solvent. In an embodiment, the photosensitive compound 302 is a photographic material, for example, silver halide (i.e., silver salt). In an embodiment, the silver halide may include silver and a halogen in the form AgX, and may include, for example, silver bromide (AgBr), silver chloride (AgCl), silver iodide (AgI), and/or a silver fluoride ($Ag_xFl_y$). Silver fluorides include silver subfluoride ($Ag_2F$), silver (I) fluoride (AgF), and silver (II) fluoride ($AgF_2$). The silver halide may include silver halide crystals suspended within a gelatin. The silver halide layer may further include trace elements, for example, to alter light sensitivity. As known in the art of photography, upon exposure to light, the silver halide crystals reduce to include, among other things, metallic silver. The photosensitive compound 302 may be dispensed onto the substrate 304 at any suitable thickness.

In an embodiment, the photosensitive compound 302, such as a silver halide compound, a compound including silver halide, or another compound including silver, is dispensed as a layer onto the substrate 304 such that the photosensitive compound 302 on the substrate 304 has a silver (Ag) concentration within a specific range. In an embodiment, the photosensitive compound 302 dispensed onto the substrate 304 may include silver at a concentration of from about 5.0 milligrams per square meter ($mg/m^2$) to about 150 $mg/m^2$, or from about 50 $mg/m^2$ to about 150 $mg/m^2$, or from about 100 $mg/m^2$ to about 150 $mg/m^2$. In some embodiments, the photosensitive compound has a silver concentration of from at least 5.0 $mg/m^2$ to 150 $mg/m^2$.

If the silver concentration of the photosensitive compound used to form the completed structure is insufficient, the electrical resistance of the completed structure may be excessively high or may result in a structure with an electrical open. A structure formed with a photosensitive compound having an insufficient silver concentration would therefore require an additional conductive layer such as an electrically conductive overcoat, undercoat, or other electrically conductive layer manufactured from, for example, copper to augment the electrical conductivity of the completed structure. In an embodiment of the present teachings, the completed structure formed using the photosensitive compound 302 does not include (i.e., is free from) an additional electrically conductive structure that would augment or enhance the electrical conductivity of the completed structure. In this embodiment, the electrical pathway through the antenna or other structure formed from the photosensitive compound is provided entirely by the resulting silver layer.

If the silver concentration of the photosensitive compound used to form the completed structure is excessive, the completed structure may have an excessive thickness and/or an excessive cost of manufacture, or manufacturing complications may result during processing.

The substrate 304 may be, for example, a carrier from which the completed multiresonator is transferred during fabrication of the RFID device. In another embodiment, the substrate 304 may be a semiconductor substrate that will form a portion of the completed RFID device.

The light source 308 may be a light source that outputs an intensity and wavelength of light that is sufficient to expose the photosensitive compound 302 through the mask 306. For example, the light source 308 may output a wavelength of from about 400 nanometers (nm) to about 750 nm. The photosensitive compound 302 may have an International Standards Organization (ISO) speed of from 50 to 3200 and, as such, the intensity of the light source for a given output wavelength may be selected to expose the photosensitive film over a desired exposure duration.

After positioning the assembly 300 as depicted in FIG. 3, light 400 from the light source 308 is transmitted through, and patterned by, the mask 306 and onto first portions of the photosensitive compound 302, while second portions of the photosensitive compound remain unexposed to the light. Transmitting the light 400 through the mask 306 forms a light pattern 404 that is shined onto the first portions photosensitive compound 302. Exposing the first portions of the photosensitive compound 302 to the light pattern 404 reduces the first portions of the photosensitive compound 302 to a metal layer 402, such as a metallic silver layer 402, having a pattern that is determined at least in part by the patterned mask 306. The second portions of the photosensitive compound 302 that are not exposed to the light pattern remain unreduced.

Figure 4:
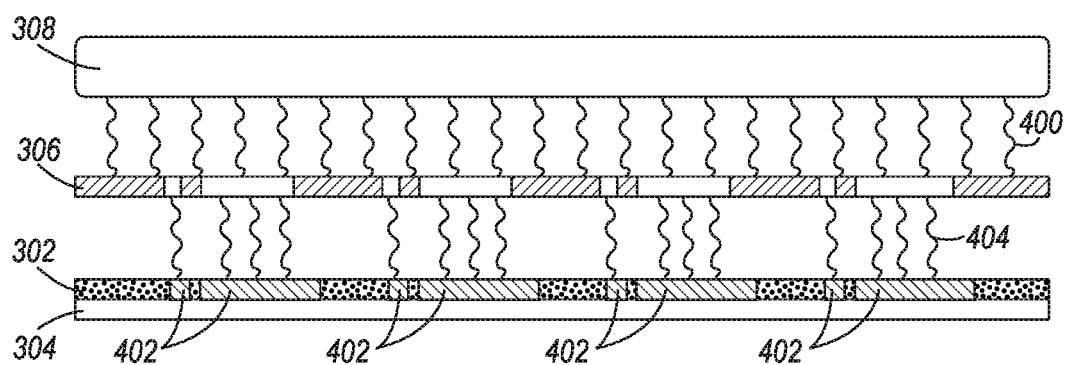
FIG. 4 depicts the in-process FIG. 3 structure during exposure of the photosensitive layer to light from the light source.

FIG. 4 depicts direct transmission of the light 400 from the light source 308 to the photosensitive compound 302. It will be appreciated that reflective and refractive techniques may be employed between the light source 308 to the photosensitive compound 302 for an indirect transmission of the light 400 from the light source 308 to the photosensitive compound 302.

Figure 5:
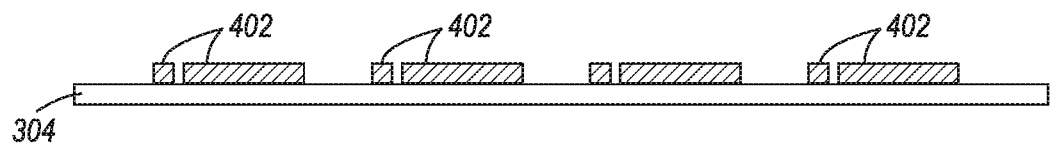
FIG. 5 is a cross section depicting a multiresonator after formation using an embodiment of the present teachings.

After exposing the photosensitive compound 302 to light as depicted in FIG. 4 to form the metal layer 402, the remaining unexposed photosensitive compound 302 may be dissolved within a solution and rinsed away to form the structure of FIG. 5, which may be analogous to the structure of FIG. 2. In an embodiment, the unexposed photosensitive compound 302 may be removed by a conventional process of photographic development as known in the art.

Subsequently, after rinsing the second portion of the photosensitive compound, processing may continue to form an RFID circuit from the metal layer 402. The metal layer 402 may be used as, for example, a transmit antenna 102 (FIG. 1), a receive antenna 106, a multiresonator 104, or another RFID structure. Subsequent to forming the RFID circuit from the metal layer 402, the metal layer 402 may have a thickness of from about 100 nm to about 800 nm.

Figure 6:
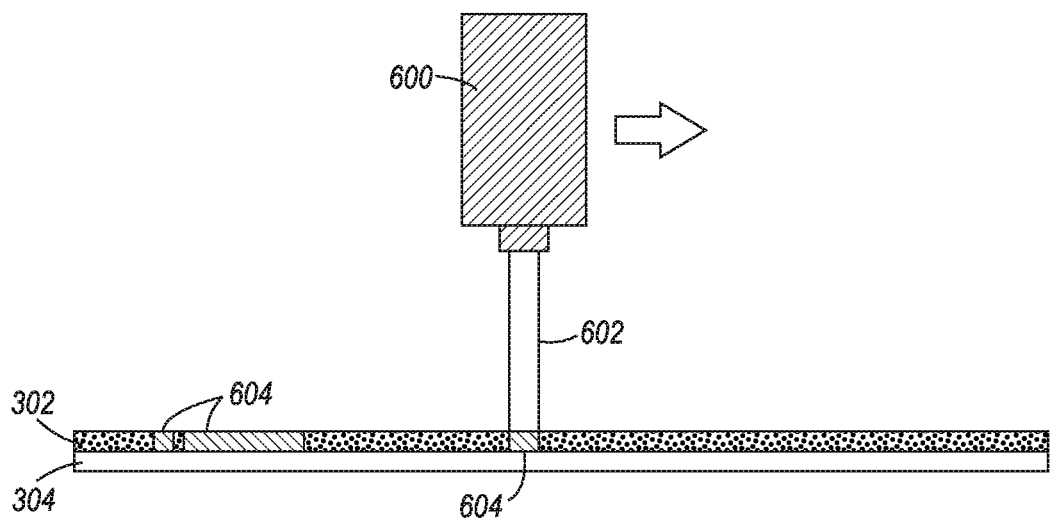
FIG. 6 is a cross section during a direct write process using a laser in an embodiment of the present teachings.

In another embodiment, as depicted in FIG. 6, a laser 600 outputting a laser beam 602 may be used as a light source to expose the photosensitive compound such that a patterned mask is not needed. In this embodiment, a scan path of the laser 600 and thus the laser beam 602 across the surface of the substrate 304 may be programmed into a controller (not depicted for simplicity). As the laser 600 scans across the surface of the substrate 304, the laser beam 602 is transmitted onto the photosensitive compound 302, thereby exposing the photosensitive compound 302 to a light pattern and reducing the exposed portions to a metal layer 604. This embodiment may allow for a simplified customization of the multiresonator pattern at a reduced cost, as the desired pattern is programmed into the controller rather than requiring the formation of a mask.

The laser 600 may be, for example, a helium-neon (HeNe) laser outputting a narrowly distributed light wavelength of about 632.8 nm at an intensity of from about 1.5 milliwatts (mW) to about 35 mW.

Thus the present teachings may include the use of a photographic technique to form one or more RFID structures, for example, an antenna such as a receive antenna and/or a transmit antenna. The method may further be used to form other RFID structures such as a multiresonator, conductive lines and/or conductive interconnects, etc. In contrast to laser ablation of a metallized Mylar layer to form RFID structures, which requires a relatively costly high-powered laser, the present teachings may include exposure of a photosensitive layer that is patterned through the use of a patterned mask or a direct write process using a relatively inexpensive low-powered laser.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a radio frequency identification (RFID) device, comprising:
    coating a layer comprising a photosensitive compound on a substrate, wherein the layer comprising the photosensitive compound has a silver concentration of from 5.0 milligrams per square meter (mg/m$^2$) to 150 mg/m$^2$;
    exposing first portions of the layer comprising the photosensitive compound to a light pattern from a light source to convert the first portions of the layer comprising the photosensitive compound to a metal layer while second portions of the layer comprising the photosensitive compound remain unexposed to the light pattern;
    removing the second portions of the layer comprising the photosensitive compound and leaving the metal layer on the substrate;
    forming an RFID circuit from the metal layer, wherein the forming of the RFID circuit from the metal layer forms at least one antenna; and
    forming a completed RFID transponder wherein, subsequent to forming the completed RFID transponder, the at least one antenna is free from an additional electrically conductive structure that would augment or enhance an electrical conductivity of the antenna.

2. The method of claim 1, further comprising forming the light pattern by transmitting light from the light source through a patterned mask or reticle.

3. The method of claim 1, further comprising forming the light pattern by directly writing the light pattern onto the layer comprising the photosensitive compound using a laser beam from a laser.

4. The method of claim 1, wherein the forming of the at least one antenna from the metal layer forms at least one of a transmit antenna and a receive antenna.

5. The method of claim 1, wherein the forming of the RFID circuit from the metal layer further comprises forming a multiresonator from the metal layer.

6. The method of claim 1, wherein the photosensitive compound is a silver halide.

7. The method of claim 1 wherein the metal layer is a silver layer having a thickness of from 100 nanometers to 800 nanometers.

8. The method of claim 1, wherein the layer comprising the photosensitive compound has a silver concentration of from 50 mg/m$^2$ to 150 mg/m$^2$.

9. The method of claim 1, wherein the layer comprising the photosensitive compound has a silver concentration of from 100 mg/m$^2$ to 150 mg/m$^2$.

10. A method for forming a radio frequency identification (RFID) device, comprising:
    coating a layer comprising silver halide on a substrate, wherein the layer comprising silver halide has a silver concentration of from 5.0 milligrams per square meter (mg/m$^2$) to 150 mg/m$^2$;
    exposing first portions of the layer comprising silver halide to a light pattern from a light source to convert the first portions of the layer comprising silver halide to a metal layer while second portions of the layer comprising silver halide remain unexposed to the light pattern;
    removing the second portions of the layer comprising silver halide and leaving the metal layer on the substrate;
    forming an RFID circuit, wherein the RFID circuit comprises at least one antenna formed from the metal layer; and
    forming a completed RFID transponder wherein, subsequent to forming the completed RFID transponder, the at least one antenna is free from an additional electrically conductive structure that would augment or enhance an electrical conductivity of the antenna.

11. The method of claim 10, further comprising forming the light pattern by transmitting light from the light source through a patterned mask or reticle.

12. The method of claim 10, further comprising forming the light pattern by directly writing the light pattern onto the layer comprising the silver halide using a laser beam from a laser.

13. The method of claim 10 wherein the metal layer is a silver layer having a thickness of from 100 nanometers to 800 nanometers.

14. The method of claim 10, wherein the layer comprising silver halide has a silver concentration of from 50 mg/m$^2$ to 150 mg/m$^2$.

15. The method of claim 10, wherein the layer comprising silver halide has a silver concentration of from 100 mg/m$^2$ to 150 mg/m$^2$.

16. The method of claim 10, wherein the forming of the RFID circuit from the metal layer further forms a multiresonator.

\* \* \* \* \*